(12) United States Patent
Utsunomiya et al.

(10) Patent No.: US 7,602,052 B2
(45) Date of Patent: Oct. 13, 2009

(54) SEMICONDUCTOR DEVICE

(75) Inventors: Satoshi Utsunomiya, Kyoto (JP); Yoshihiro Takano, Shioya-gun (JP)

(73) Assignee: Panasonic Corporation, Osaka (JP)

( * ) Notice: Subject to any disclaimer, the term of this patent is extended or adjusted under 35 U.S.C. 154(b) by 153 days.

(21) Appl. No.: 11/224,982

(22) Filed: Sep. 14, 2005

(65) Prior Publication Data
US 2006/0267166 A1    Nov. 30, 2006

(30) Foreign Application Priority Data
May 24, 2005  (JP)  ............................. P2005-151280
Aug. 9, 2005  (JP)  ............................. P2005-230924

(51) Int. Cl.
*H01L 23/495* (2006.01)
(52) U.S. Cl. .................. 257/672; 257/676; 257/678; 257/694; 257/696; 257/E23.001
(58) Field of Classification Search ................. 257/666, 257/672, 676, 692, 694–696, 670, 678; 438/123, 438/FOR. 366, FOR. 367, FOR. 377, FOR. 380
See application file for complete search history.

(56) References Cited

U.S. PATENT DOCUMENTS 5,942,794 A * 8/1999 Okumura et al. ............. 257/666
6,020,625 A * 2/2000 Qin et al. ..................... 257/666
6,175,150 B1 * 1/2001 Ichikawa et al. ............. 257/676
6,208,023 B1 * 3/2001 Nakayama et al. .......... 257/696
6,242,800 B1   6/2001 Munos et al.

FOREIGN PATENT DOCUMENTS

| JP | 53-132975 | * 11/1978 |
| JP | 2001-196518 | 7/2001 |
| JP | 2001-320009 | 11/2001 |
| JP | 2004-247612 | 9/2004 |

OTHER PUBLICATIONS

Japanese Notification of Reasons for Refusal, w/ English translation thereof, issued in Japanese Patent Application No. JP 2005-230924 dated Feb. 17, 2009.

* cited by examiner

*Primary Examiner*—Jasmine J Clark
(74) *Attorney, Agent, or Firm*—McDermott Will & Emery LLP

(57) ABSTRACT

To prevent a semiconductor device which can be made to be small even though a big-sized chip is used and in which a MOSFET having a low on-resistance can be formed, a semiconductor device according to the invention includes a resin package; at least two main leads that are integrated within the resin package so as to constitute a chip mounting portion; a semiconductor chip mounted on the chip mounting portion; and first and second surface leads each electrically connected to an electrode formed on a surface of the semiconductor chip. The main leads and the first and second surface leads protrude outward along a bottom surface of the resin package, respectively.

12 Claims, 11 Drawing Sheets

FIG. 1 (a)
FIG. 1 (b)
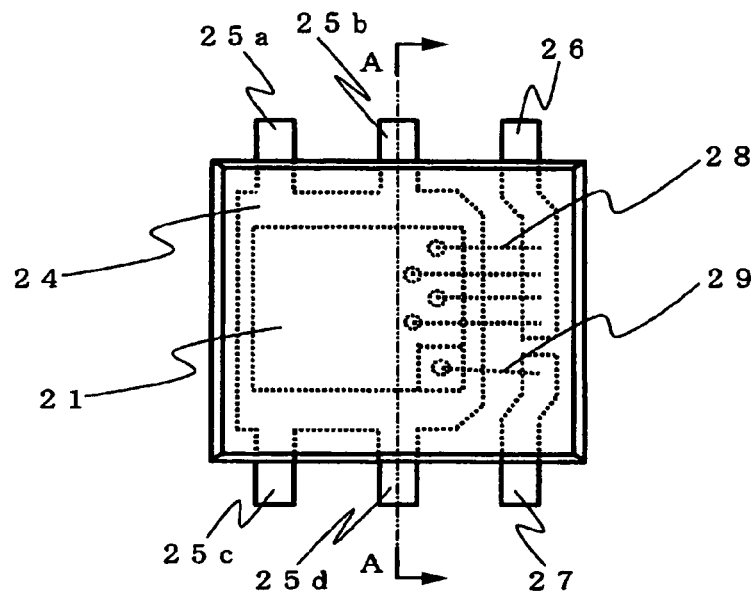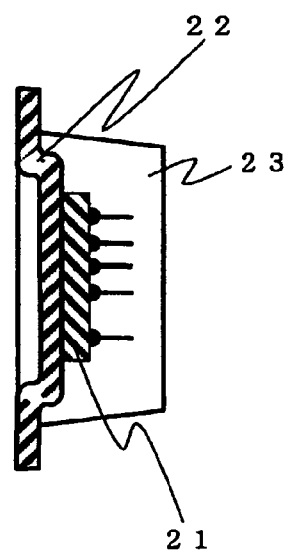
FIG. 1 (c)
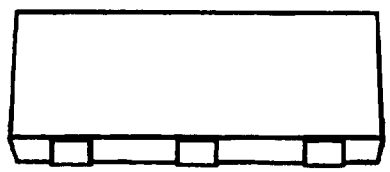

SEMICONDUCTOR DEVICE

BACKGROUND OF THE INVENTION

1. Field of the Invention

The invention relates to a semiconductor device, and in particular, to a semiconductor device used as a switching element of a power circuit.

2. Description of the Related Art

In recent years, as electronic apparatuses such as personal computers and mobile phones are miniaturized, electronic components have been mounted in high density, and for this reason, various researches are ongoing in order to reduce a mounting area of a semiconductor device such as a diode or a transistor. Among such semiconductor devices, a switching MOSFET, which is used as a load switch to switch a power source such as a battery, is required to improve a heat dissipation efficiency and to reduce on-resistance in addition that it is required to make it small and thin.

In consideration of the above, a technique, in which the shape of a main pad on which a semiconductor chip is to be mounted is changed, has been proposed (for example, see U.S. Pat. No. 6,242,800).

FIG. 11(a) is a top view showing a conventional semiconductor device, FIG. 11(b) is a cross-sectional view taken along the line A-A of FIG. 11(a), and FIG. 11(c) is a side view showing the semiconductor device of FIG. 11(a). As shown in FIG. 7, a lead terminal protruding outward from the resin package has been a gull wing type one, which is bent downward along the side surface of the package.

Next, a structure of the semiconductor device according to the related art will be described. A semiconductor chip 1 is mounted on a main pad 2 upside down. The main pad 2 is integrated with leads 3, 4, 5, and 6. First and second surface leads 7 and 8 are separated from the main pad 2 to protrude outward from a resin package 9. The first surface lead 7 and a source electrode 10 are wire-bonded through a plurality of wires 11. Similarly, the second surface lead 8 and a gate electrode 12 are wire-bonded through a wire 13. A surface of a semiconductor chip 11 being in contact with the main pad 2 includes a drain electrode.

According to the above-mentioned structure, the semiconductor chip is mounted on a lower surface of the main pad, so that it is possible to make a semiconductor device thin. Also, the drain electrode is mounted on the main pad having a large area, so that it is possible to achieve excellent heat dissipation efficiency.

Recently, in a portable apparatus, such as a mobile phone using a battery as a power, a problem to be solved is to reduce power consumption in electronic components including a semiconductor device mounted inside the apparatus in order to increase the power capacity available by charging one-time, in addition to making the apparatus thin and have high functionality.

SUMMARY OF THE INVENTION

The invention is designed to solve the above-mentioned problems, and it is an object of the invention to provide an improved semiconductor device, which is very thin and has excellent heat dissipation efficiency and in which on-resistance thereof can be reduced.

In order to achieve the above objects, according to the invention, a semiconductor device includes: a resin package; at least two main leads that are integrated within the resin package so as to constitute a chip mounting portion; a semiconductor chip mounted on the chip mounting portion; and first and second surface leads each electrically connected to an electrode formed on a surface of the semiconductor chip. The main leads and the first and second surface leads protrude outward along a bottom surface of the resin package, respectively.

According to the above-mentioned structure, the main leads and the first and second surface leads extend along the same plane as the bottom surface of the resin package, so that it is possible to make a semiconductor device thin, to make an outer lead, that is, a protruding portion of each lead protruding outward from the resin package short, and to reduce the chip mounting area and the on-resistance. In addition, when the size of the semiconductor chip increases, there is no need to bend leads after resin sealing, and in a process of making shapes of the leads, the resin does not deform or crack even though the thickness of the resin is small, and as a result, it is possible to provide a thin and highly reliable semiconductor device.

Further, in the semiconductor device according to the invention, it is preferable that the main leads and the first and second surface leads be bent within the resin package, respectively.

According to the above-mentioned structure, since there is no need to bend leads after resin sealing, the resin does not deform or crack in a process of making shapes of the leads even though the thickness of the resin is small, and accordingly, it is possible to provide a thin and highly reliable semiconductor device. Also, it is possible to increase adhesion between the resin package and the first and second surface leads and adhesion between the resin package and the main leads.

Furthermore, in the semiconductor device according to the invention, it is preferable that the chip mounting portion be formed in a plane composed of surfaces of the main leads located at an upper surface side of the resin package.

According to the above-mentioned structure, it is possible to make the semiconductor device thin.

In addition, in the semiconductor device according to the invention, it is preferable that at least one main lead protrude outward from one of two sides of the chip mounting portion being disposed to be opposite to each other and at least one main lead extend outward from the other side of the two sides.

According to the above-mentioned structure, the semiconductor device is easy to be mounted on a printed board and is stable, and accordingly, a highly reliable semiconductor device can be provided.

Moreover, in the semiconductor device according to the invention, it is preferable that the main leads include a plurality of leads, the plurality of leads each having a larger width than the first and second surface leads or being configured such that the gap therebetween becomes smaller than that between the first and second surface leads in protruding regions of the main leads protruding outward from the resin package.

According to the above-mentioned structure, heat generated in the semiconductor chip can be effectively dissipated to the printed board.

Further, in the semiconductor device according to the invention, it is preferable that the main leads, located to be opposite to each other in the chip mounting portion, have different widths.

According to the above-mentioned structure, the semiconductor device is easy to be mounted on a printed board and is stable, and the heat generated in the semiconductor chip can be effectively dissipated to the printed board.

Furthermore, in the semiconductor device according to the invention, it is preferable that the first and second surface leads be disposed to be symmetrical with respect to a center line of the resin package in a protruding region thereof.

According to the above-mentioned structure, it is easy to form a wiring pattern of a printed board on which the semiconductor device is to be mounted, thereby improving the reliability of the semiconductor device.

In addition, in the semiconductor device according to the invention, it is preferable that the semiconductor chip be mounted on an entire surface of the chip mounting portion with a face thereof up.

According to the above-mentioned structure, the heat generated in the semiconductor chip can be effectively dissipated to the printed board, and the package can be made to be thin.

Moreover, in the semiconductor device according to the invention, it is preferable that the resin package be configured such that the distance from an upper surface of the semiconductor chip to an upper surface of the resin package is 0.25 to 0.40 mm.

According to the above-mentioned structure, the heat generated in the semiconductor chip can be effectively dissipated to the printed board, and the package can be made to be thin.

Further, in the semiconductor device according to the invention, it is preferable that the main leads is formed with an opening; and a sealing resin constituting the resin package is filled in the opening formed in the main leads.

According to the above-mentioned structure, since the sealing resin constituting the resin package is filled in the opening formed in the main leads, the adhesion between the resin package and the main leads can be improved. As a result, it is possible to prevent the resin package and the main leads from peeling off (swelling up by heat), which is occurred because air or moisture infiltrated into a boundary face between the main lead and the resin package are heated and expanded.

As described above, according to the invention, it is possible to make the semiconductor device thin and light weighted by mounting the semiconductor chip on an upper surface of the main pad.

Further, since flat type leads are employed, when the semiconductor device is mounted on the printed board, the distance from the printed board and the semiconductor chip mounted within the resin package is short, and the bottom surface of the resin package is in direct contact with the printed board to be fixed, so that the heat generated in the semiconductor chip can be effectively dissipated to the printed board. Also, the leads are short, on-resistance thereof can be reduced.

In addition, the main pad can have a sufficient area, a big-sized semiconductor chip can also be mounted.

BRIEF DESCRIPTION OF THE DRAWINGS

FIG. 1(a) is a top view showing a semiconductor device according to a first embodiment of the invention, FIG. 1(b) is a cross-sectional view taken along the line A-A of FIG. 1(a), and FIG. 1(c) is a side view showing the semiconductor device of FIG. 1(a).

DESCRIPTION OF THE PREFERRED EMBODIMENTS

Figure 2:
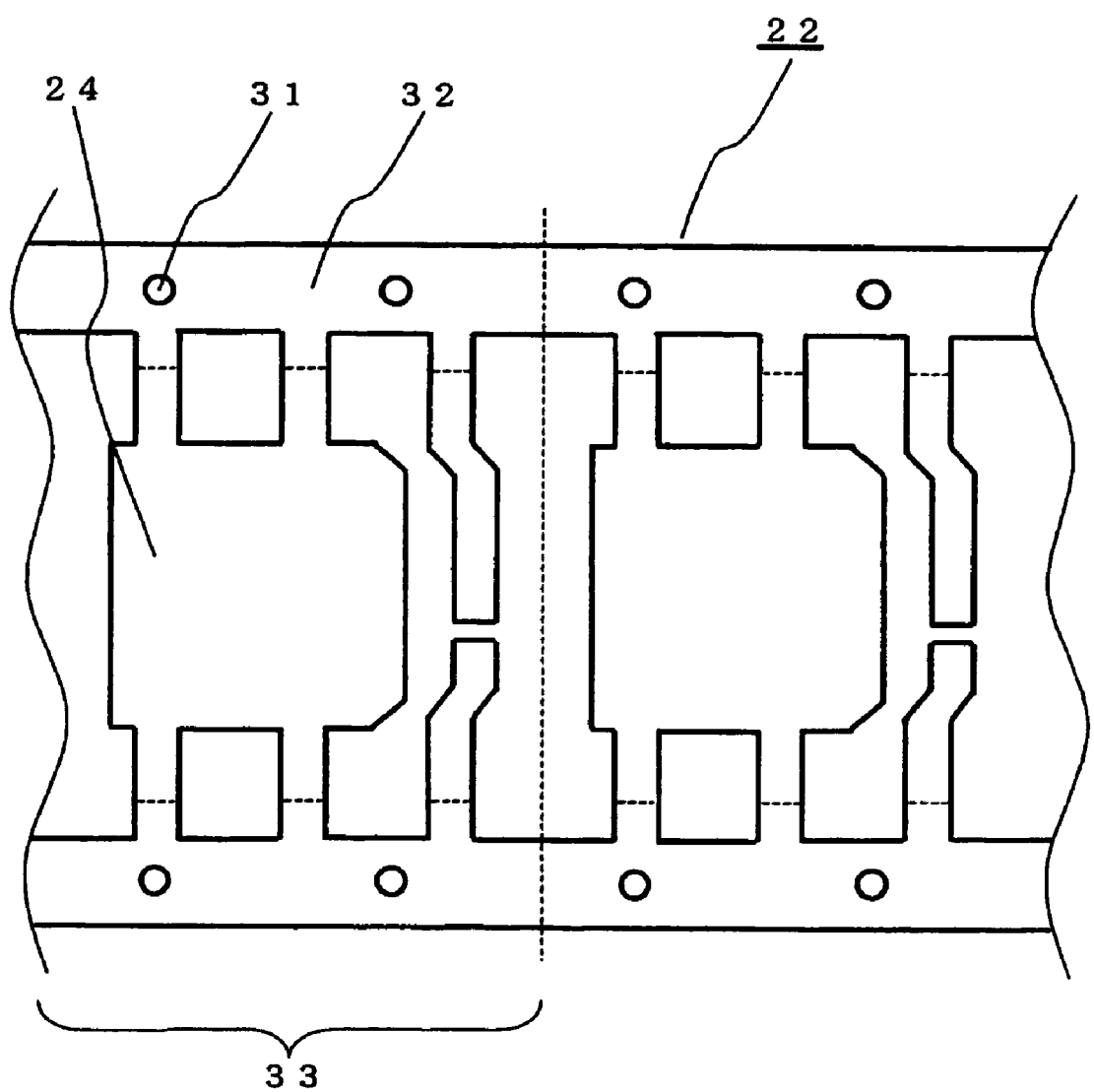
FIG. 2 is an enlarged view showing essential parts of a lead frame according to the first embodiment of the invention.

Hereinafter, preferred embodiments of the invention will be described with reference to the accompanying drawings.

First Embodiment

FIG. 1(a) is a top view showing a MOSFET (semiconductor device) according to a first embodiment of the invention, FIG. 1(b) is a cross-sectional view taken along the line A-A of FIG. 1(a), and FIG. 1(c) is a side view showing the MOSFET of FIG. 1(a). The semiconductor device is constructed by mounting a semiconductor chip 21 constituting the MOSFET on a lead frame 22 provided with flat-type leads and then by sealing it with a resin package 23, thereby becoming a surface-mounting type semiconductor device. More specifically, the semiconductor device includes the resin package 23, four main leads 25a, 25b, 25c, and 25d integrated within the resin package 23 so as to constitute a chip mounting portion 24, the semiconductor chip 21 mounted on the chip mounting portion 24, a first surface lead 26 connected to a source electrode of the semiconductor chip 21, a second surface lead 27 connected to a gate electrode of the semiconductor chip 21, and a drain electrode brought into contact with the semiconductor chip 21. The main leads 25a, 25b, 25c, and 25d protrude outward along a bottom side of the resin package 23.

Here, the chip mounting portion 24 is fixed to the drain electrode formed on the entire back surface of the semiconductor chip 21 by means of conductive adhesive and is connected with the outside through the four main leads 25a, 25b, 25c, and 25d. Further, the first and second surface leads 26 and 27 are separated from the main leads, respectively, and a protruding region of the first surface lead 26 and a protruding region of the second surface lead 27 are leaded out to be symmetrical with respect to a center line of the resin package 23 to thereby be connected to the source electrode and the gate electrode formed on the surface of the semiconductor chip 21 through bonding wires 28 and 29, respectively. The lead frame 22 is formed by covering a long copper plate with an Sn-2Bi plated layer. Also, the thickness of each lead is 0.11 mm and the width thereof is 0.2 mm.

Next, a method of mounting the semiconductor device will be described. First, a method of manufacturing a lead frame will be described. As shown in FIG. 2, the lead frame 22 is formed by punching a plate-like body (copper plate) made of metal and by covering the punched plate-like body with the Sn-2Bi plated layer by means of an electrolytic plating method. In the lead frame 22, a plurality of units 33 are connected to one another by means of side bars 32 having sprocket holes 31. Further, the chip mounting portion 24 is formed to locate slightly over a lead plane by the punching process. This is to make a wire resistance small by reducing the distance between a pad of the semiconductor chip and leads to thereby make bonding wires short.

Next, a method of mounting the MOSFET on the lead frame will be described.

Figure 3:
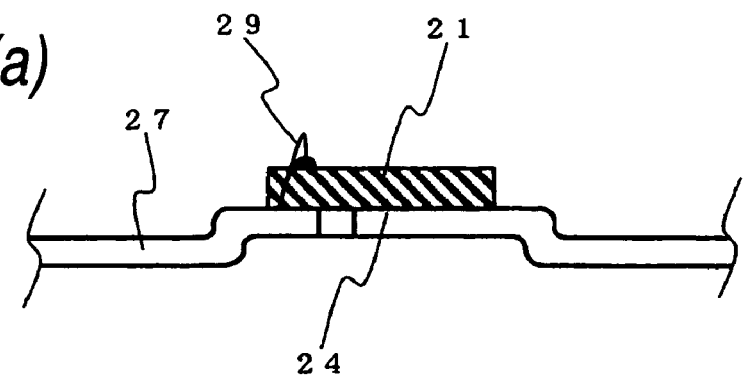
FIGS. 3(a) to 3(d) are views showing processes of manufacturing the semiconductor device according to the first embodiment of the invention.
Figure 3:
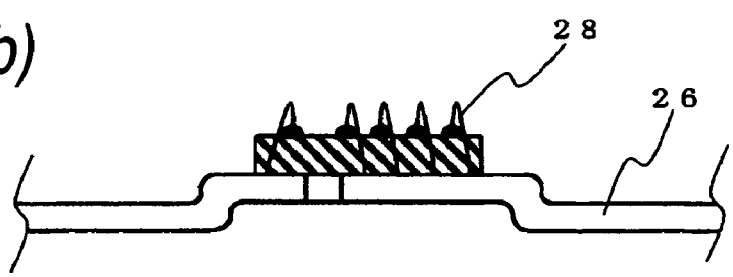
Figure 3:
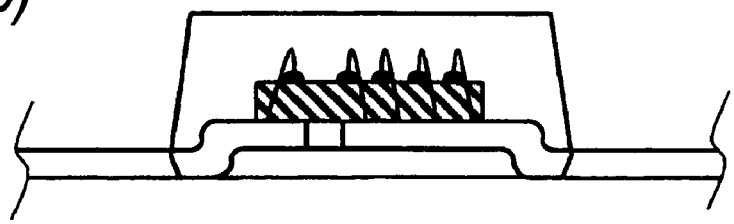
Figure 3:
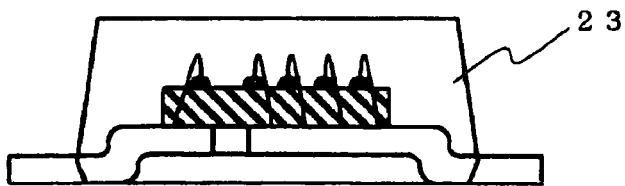

As shown in FIG. 3(a), the back surface of the semiconductor chip 21 constituting the MOSFET is mounted on the chip mounting portion 24 of the lead frame shown in FIG. 2 to be fixed, and the second surface lead 27 is connected to a gate electrode formed on a surface of the semiconductor chip 21 by means of the bonding wire 29.

Thereafter, as shown in FIG. 3(b), the first surface lead 26 is connected to the source electrode formed on the surface of the semiconductor chip 21 by means of the bonding wire 28. Then, as shown in FIG. 3(c), a sealing process using epoxy resin is performed to form the semiconductor device.

Finally, as shown in FIG. 3(d), each lead is cut away from the side bar 32 such that the protruding region of each lead protruding outward from the resin package 23 has a predetermined length, thereby obtaining a surface-mounting type semiconductor device having flat-type leads.

According to the above-mentioned structure, the main leads and the first and second surface leads protrude outward along the bottom surface of the resin package 23, so that it is possible to make the semiconductor device thin and light weighted. In the embodiment of the invention, the thickness of the resin package 23 is 0.7 mm, and the distance from an upper surface of the semiconductor chip 21 to an upper surface of the resin package 23 is 0.25 to 0.40 mm. In addition, since an outer lead, that is, an outwardly protruding portion of each lead protruding outward from the resin package 23 can be made to be short, the chip mounting area and the on-resistance can be reduced. In the embodiment of the invention, the length of the outwardly protruding portion of each lead protruding outward from the resin package 23 is 0.2 mm. Also, the on-resistance of each lead is reduced to 0.23 m$\Omega$, as compared with 2.67 m$\Omega$ in the related art.

Further, since the four main leads connected to the entire back surface of the semiconductor chip 21 protrude outward from the resin package 23, the contact resistance of the drain terminal is significantly reduced. In particular, since the four main leads are flat-type leads, the length of each lead is short, and since the area of each lead being in contact with a wiring layer on a printed board is large, the resin package has excellent heat dissipation characteristic.

Furthermore, although the size of the semiconductor chip increases, there is no need to bend leads after a resin sealing process. Also, in a process of making the shape of the lead, the resin does not deform or crack even though the thickness of the resin is small, so that it is possible to provide a thin and highly reliable semiconductor device. In the embodiment of the invention, the maximum mountable size of the chip is 1.35 mm×1.24 mm.

In addition, the leads protrude outward from the resin package along the bottom surface thereof. Therefore, it is possible to provide a semiconductor device without contact failure when it is mounted on a printed board or the like. As such, according to the present embodiment, it is possible to achieve a stable external terminal structure.

Further, the main leads and the first and second surface leads are bent within the resin package. Therefore, there is no need to bend leads after a resin sealing process, and in a process of making the shape of the lead, the resin does not deform or crack even though the thickness of the resin is thin. In addition, it is possible to increase adhesion between the resin package and the first and second surface leads and adhesion between the resin package and the main leads.

Furthermore, even when the semiconductor chip is mounted on the lead frame, the chip mounting portion can be kept flat by means of the four main leads which support it, and accordingly, a highly reliable bonding operation can be performed without location deviation. Also, since the leads are cut away in a direction along the bottom surface of the resin package after resin sealing, there is no deformation in the semiconductor device.

Moreover, in the lead frame according to the invention, when wiring lines of the Sn—Bi plated layer formed on the lead surface is made of a metal, such as a gold, then a soldering operation can be easily performed and eutectic crystal can also be easily formed, and accordingly, the bonding operation can be reliably performed when mounting the lead frame on the printed board or the like. Further, the lead frame of the present embodiment can be a highly precise and reliable lead frame through a photolithographic process in addition to the punching process.

Second Embodiment

Next, a second embodiment of the invention will be described. The like numbers refer to like elements in the first embodiment.

Figure 4:
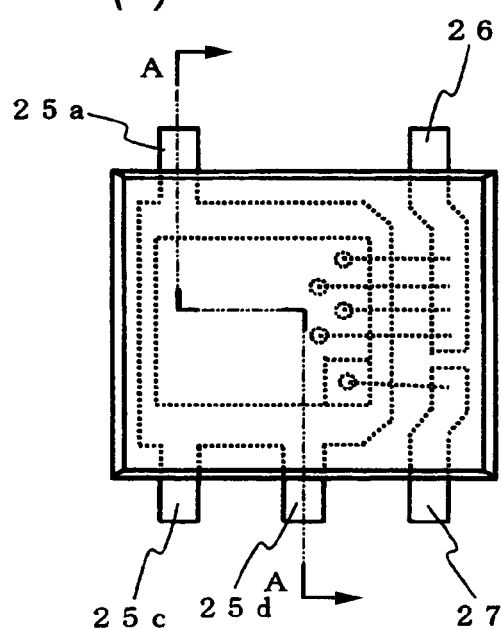
FIG. 4(a) is a top view showing a semiconductor device according to a second embodiment of the invention.
FIG. 4(b) is a cross-sectional view taken along the line A-A of FIG. 4(a)
FIG. 4(c) is a side view showing the semiconductor device of FIG. 4(a).
Figure 4:
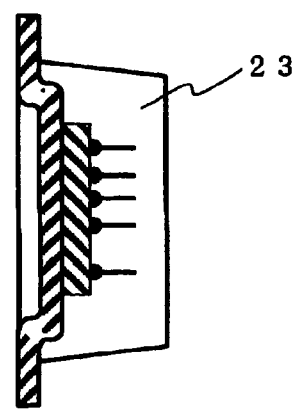
Figure 4:
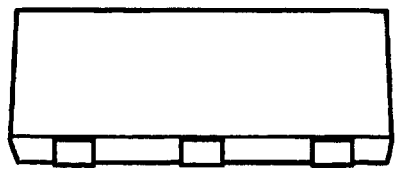

FIG. 4(a) is a top view showing a semiconductor device according to the second embodiment of the invention, FIG. 4(b) is a cross-sectional view taken along the line A-A of FIG. 4(a), and FIG. 4(c) is a side view showing the semiconductor device of FIG. 4(a). As shown in FIGS. 4(a) to 4(c), a structure of the semiconductor device of the second embodiment is the same as that of the first embodiment, except that two main leads 25c and 25d protrude outward from one of two sides being disposed to be opposite to each other and one main lead 25a protrudes outward from the other side of the two sides, first and second surface leads 26 and 27 protrude outward from a resin package 23, and the main leads are configured to be asymmetrical with respect to a center line of the resin package 23.

The semiconductor device of the present embodiment is manufactured in the same manner as in the first embodiment. However, in the second embodiment, the leads of the lead frame when a semiconductor chip is mounted or not mounted thereon are not symmetrical, so that the mounting direction can be easily confirmed, which increases a mounting efficiency.

Third Embodiment

Next, a third embodiment of the invention will be described. The like numbers refer to like elements in the first embodiment.

Figure 5:
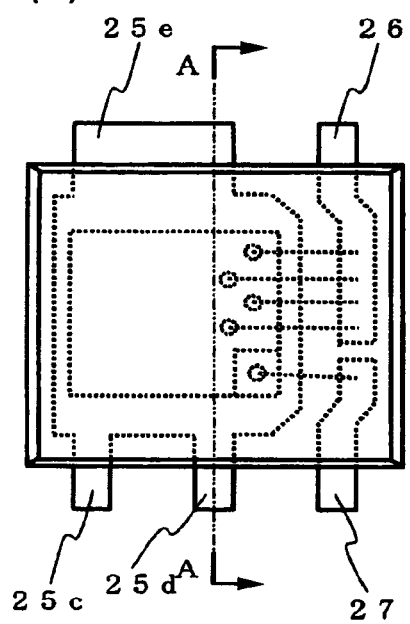
FIG. 5(a) is a top view showing a semiconductor device according to a third embodiment of the invention.
FIG. 5(b) is a cross-sectional view taken along the line A-A of FIG. 5(a)
FIG. 5(c) is a side view showing the semiconductor device of FIG. 5(a).
Figure 5:
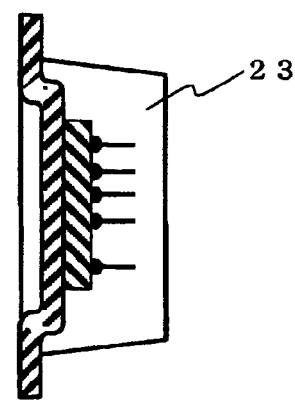
Figure 5:

FIG. 5(a) is a top view showing a semiconductor device according to the third embodiment of the invention, FIG. 5(b)

is a cross-sectional view taken along the line A-A of FIG. 5(a), and FIG. 5(c) is a side view showing the semiconductor device of FIG. 5(a). As shown in FIGS. 5(a) to 5(c), a structure of the semiconductor device of the third embodiment is the same as that of the first embodiment, except that two main leads 25c and 25d protrude outward from one of two sides being disposed to be opposite to each other and one main lead 25e protrudes outward from the other side of the two sides, first and second surface leads 26 and 27 protrude outward from a resin package 23, and the width of one main lead 25e protruding outward from the other side of the two sides is larger than those of two main leads 25c and 25d protruding outward from one of two sides. Here, the main leads are configured to be asymmetrical with respect to a center line of the resin package 23.

The semiconductor device of the present embodiment is manufactured in the same manner as in the first embodiment. However, in the third embodiment, as compared with the second embodiment, the lead frame has a lead having a large width, so that heat dissipation to a printed board increases. Further, the leads are disposed to be asymmetrical, so that the mounting direction can be easily confirmed, which also increases a mounting efficiency.

Fourth Embodiment

Next, a fourth embodiment of the invention will be described. The like numbers refer to like elements in the first embodiment.

Figure 6:
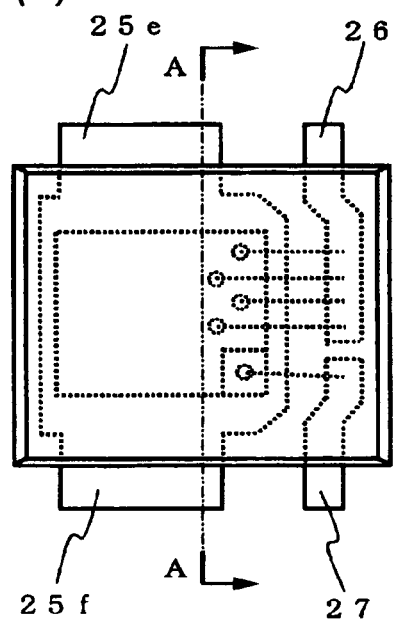
FIG. 6(a) is a top view showing a semiconductor device according to a fourth embodiment of the invention.
FIG. 6(b) is a cross-sectional view taken along the line A-A of FIG. 6(a)
FIG. 6(c) is a side view showing the semiconductor device of FIG. 6(a).
Figure 6:
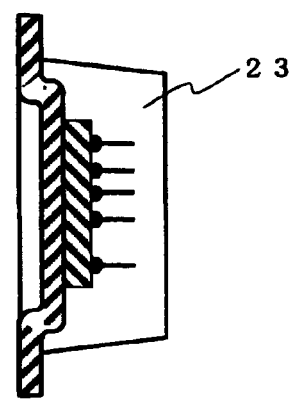
Figure 6:

FIG. 6(a) is a top view showing a semiconductor device according to the fourth embodiment of the invention, FIG. 6(b) is a cross-sectional view taken along the line A-A of FIG. 6(a), and FIG. 6(c) is a side view showing the semiconductor device of FIG. 6(a). As shown in FIG. 6(a) to 6(c), a structure of the semiconductor device of the fourth embodiment is the same as that of the first embodiment, except that one main lead 25f extends outward from one of two sides being disposed to be opposite to each other and one main lead 25e extends outward from the other side of the two sides, first and second surface leads 26 and 27 extend outward from a resin package 23, and the width of the main lead 25e protruding outward from the other side of the two sides is the same as that of the main lead 25f protruding outward from one of two sides. Here, the protruding regions of the main leads are constructed to be point-symmetrical with respect to a center of the resin package and to be symmetrical with respect to a central axis, and the protruding regions of the first and second surface leads are also constructed to be point-symmetrical with respect to the center of the resin package and to be symmetrical with respect to the central axis of the resin package.

The semiconductor device of the present embodiment is manufactured in the same manner as in the first embodiment. However, in the fourth embodiment, as compared with the second embodiment, the lead frame has a lead having a large width, so that heat dissipation to a printed board increases, and the mounting direction can be easily confirmed, which increases a mounting efficiency.

Further, in the present embodiment, since the protruding regions of the main leads are constructed to be point-symmetrical with respect to the center of the resin package and to be symmetrical with respect to the central axis and the protruding regions of the first and second surface leads are also constructed to be point-symmetrical with respect to the center of the resin package and to be symmetrical with respect to the central axis of the resin package, a semiconductor chip may be mounted with it rotated even though the location of a gate and the location of a source need to be changed, and as a result, a mounting operation becomes easy due to high flexibility in mounting.

Fifth Embodiment

Figure 7:
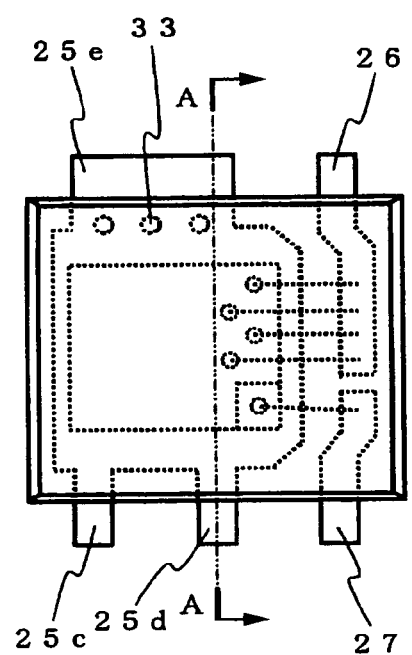
FIG. 7(a) is a top view showing a semiconductor device according to a fifth embodiment of the invention.
FIG. 7(b) is a cross-sectional view taken along the line A-A of FIG. 7(a)
FIG. 7(c) is a side view showing the semiconductor device of FIG. 7(a).
Figure 7:
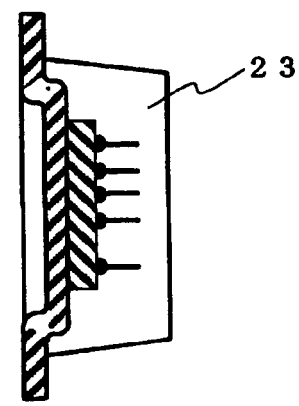
Figure 7:
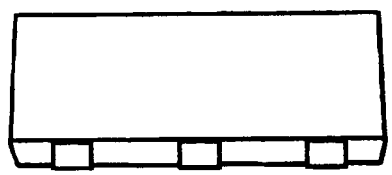

Next, a fifth embodiment of the invention will be described. According to the fifth embodiment of the invention, a structure of the semiconductor device of the fifth embodiment is the same as that of the third embodiment, except that a main lead having a large width is provided with an opening 33. FIG. 7(a) is a top view showing a semiconductor device according to the fifth embodiment of the invention, FIG. 7(b) is a cross-sectional view taken along the line A-A of FIG. 7(a), and FIG. 7(c) is a side view showing the semiconductor device of FIG. 7(a). As shown in FIGS. 7(a) to 7(c), the opening 33 is configured to have a plurality of round holes. Here, the like numbers refer to like elements in the first embodiment.

That is, according to the above-mentioned semiconductor apparatus, since the sealing resin constituting the resin package is filled in the opening formed in the main leads, the adhesion between the resin package and the main leads can be improved. As a result, it is possible to prevent the resin package and the main leads from peeling off (swelling up by heat), which is occurred because air or moisture infiltrated into a boundary face between the main lead and the resin package are heated and expanded.

Sixth Embodiment

Figure 8:
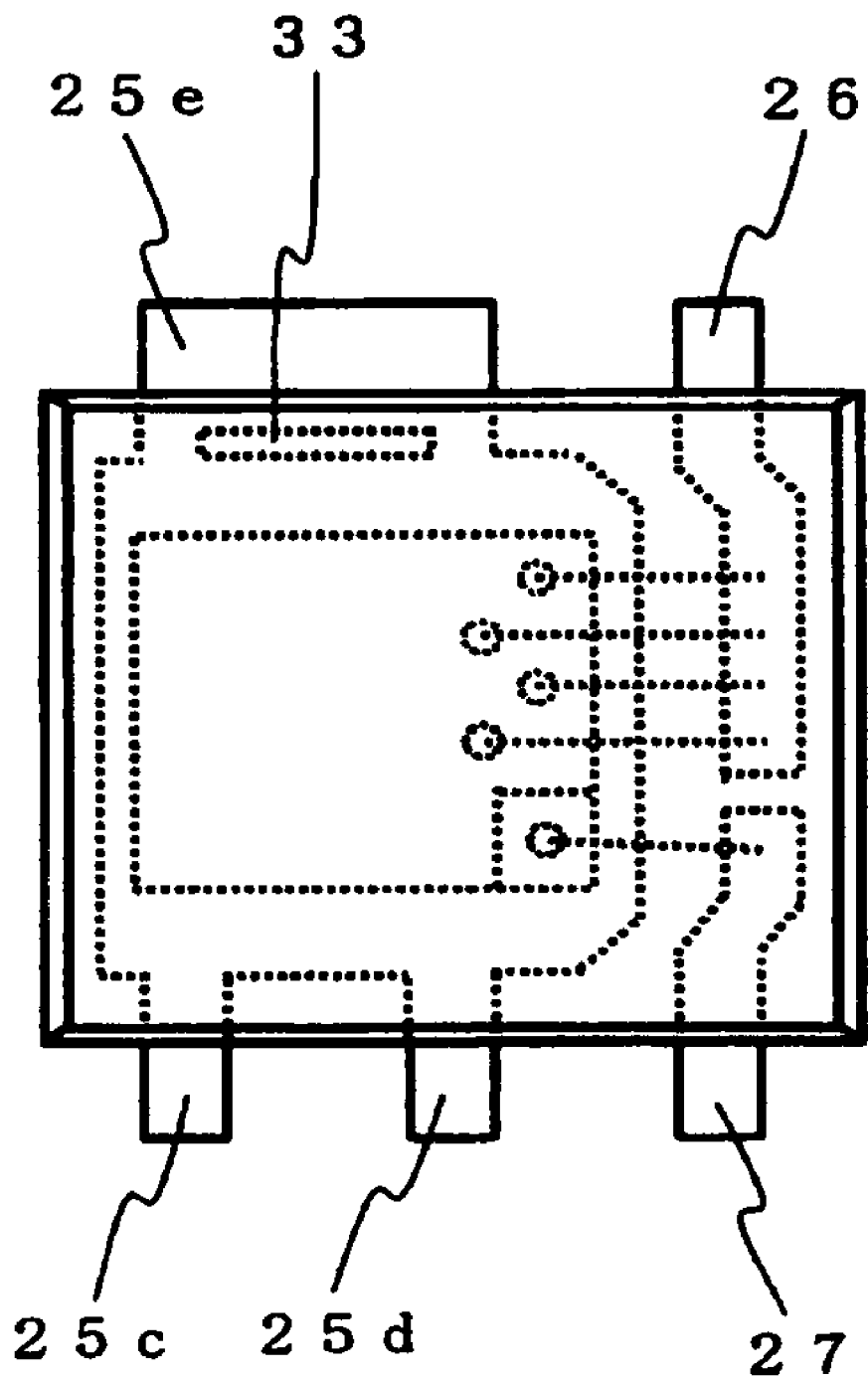
FIG. 8 is a top view showing a semiconductor device according to the sixth embodiment of the invention.

Further, although the opening 33 has the plurality of round holes in the fifth embodiment, it may be configured to have a long hole, as shown in FIG. 8.

According to the above-mentioned structure, it is possible to obtain same effects of the fifth embodiments.

Seventh Embodiment

Figure 9:
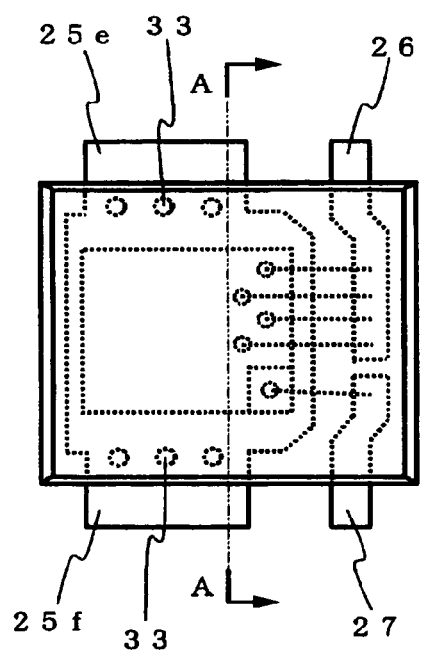
FIG. 9(a) is a top view showing a semiconductor device according to a seventh embodiment of the invention.
FIG. 9(b) is a cross-sectional view taken along the line A-A of FIG. 9(a)
FIG. 9(c) is a side view showing the semiconductor device of FIG. 9(a).
Figure 9:
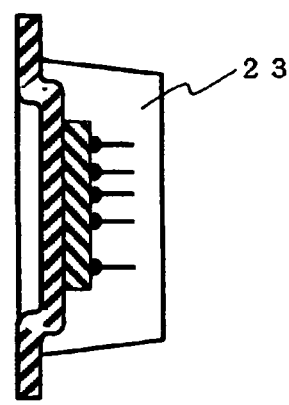
Figure 9:
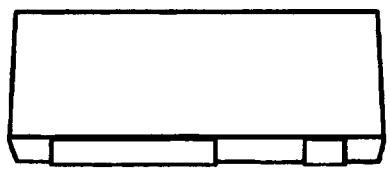
Figure 10:
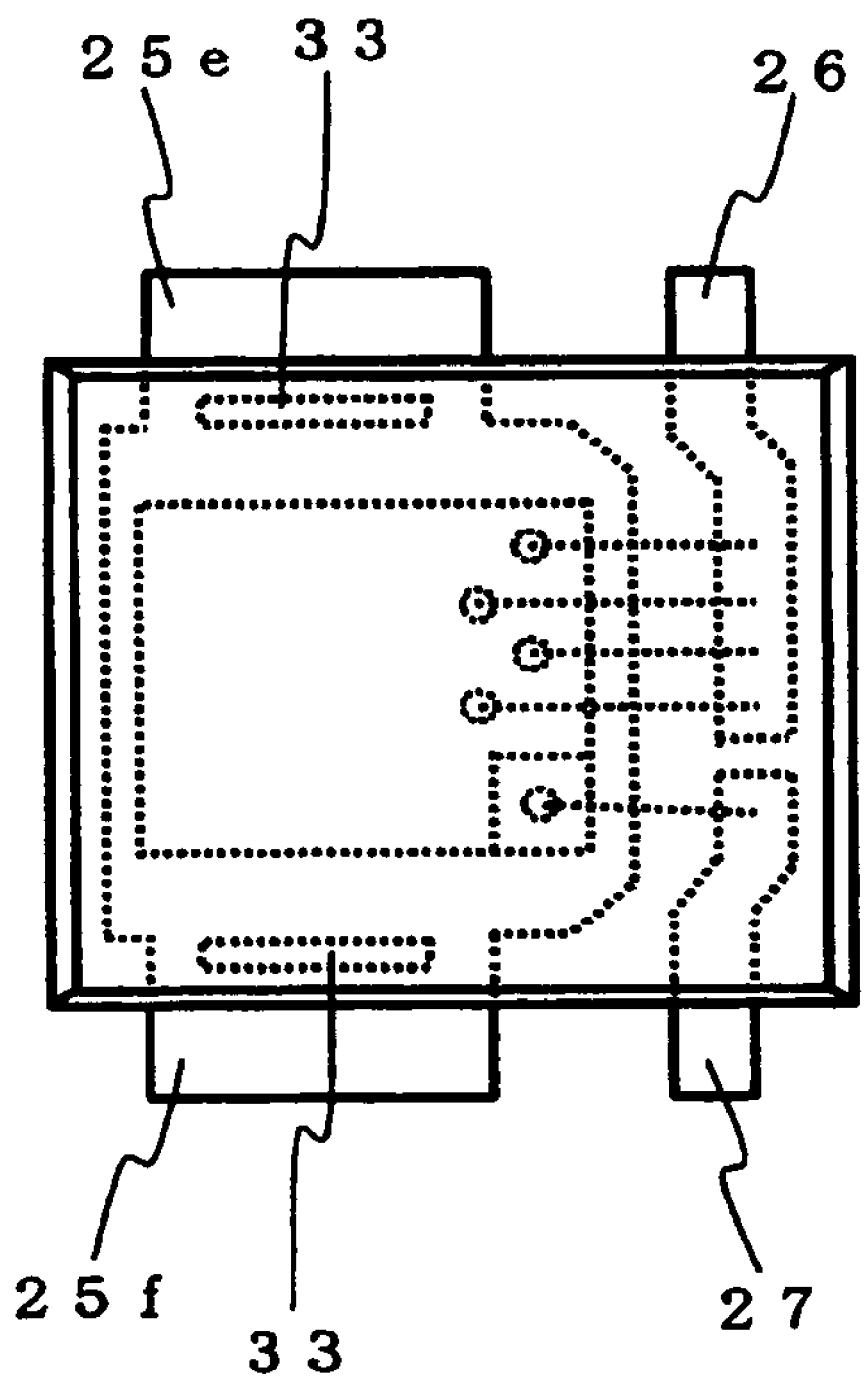
FIG. 10 is a top view showing a semiconductor device according to the eighth embodiment of the invention.
Figure 11A:
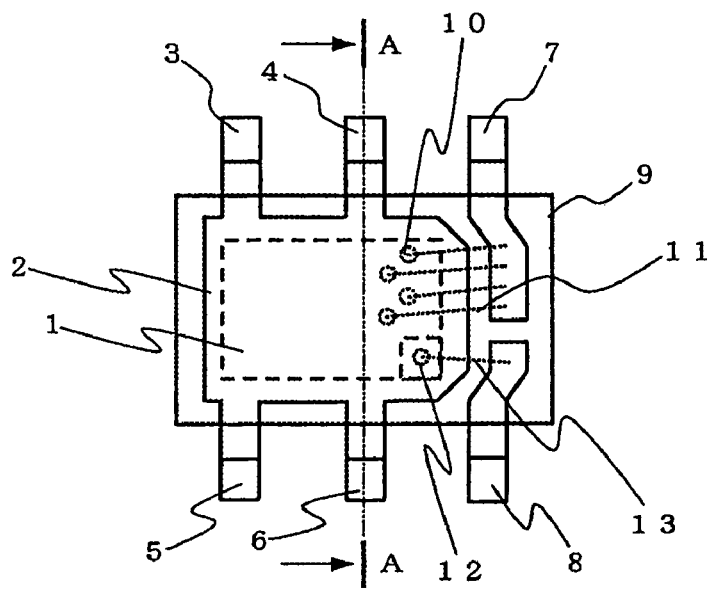
FIG. 11(a) is a top view showing a conventional semiconductor device.
Figure 11B:
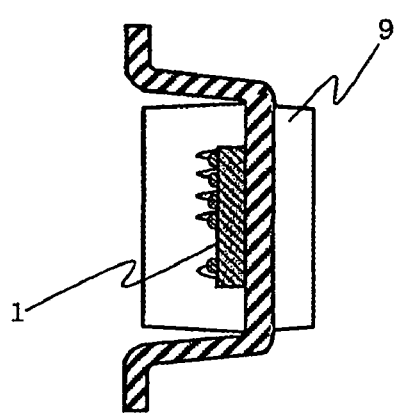
FIG. 11(b) is a cross-sectional view taken along the line A-A of FIG. 11(a)
Figure 11C:
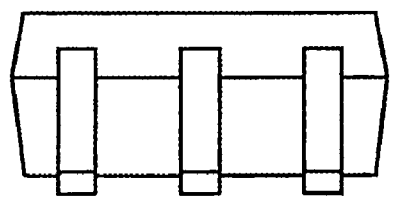
FIG. 11(c) is a side view showing the semiconductor device of FIG. 11(a).

Next, a seventh embodiment of the invention will be described. According to the fifth embodiment of the invention, a structure of the semiconductor device of the seventh embodiment is the same as that of the third embodiment, except that each of main leads having a large width is provided with an opening 33. FIG. 9(a) is a top view showing a semiconductor device according to the fifth embodiment of the invention, FIG. 9(b) is a cross-sectional view taken along the line A-A of FIG. 9(a), and FIG. 9(c) is a side view showing the semiconductor device of FIG. 9(a). As shown in FIGS. 9(a) to 9(c), the opening 33 is configured to have a plurality of round holes. Here, the like numbers refer to like elements in the first embodiment.

That is, according to the above-mentioned semiconductor apparatus, since the sealing resin for constituting the resin package is filled in the opening formed in each of the main leads, the adhesion between the resin package and the main leads can be improved. As a result, it is possible to prevent the resin package and the main leads from peeling off (swelling up by heat), which is occurred because air or moisture infiltrated into a boundary face between the main lead and the resin package are heated and expanded.

Eighth Embodiment

Further, although the opening 33 has the plurality of round holes in the fifth embodiment, it may be configured to have a long hole, as shown in FIG. 8.

According to the above-mentioned structure, it is possible to obtain same effects of the seventh embodiments.

In addition, in the above embodiments, although it has been described with respect to the method of mounting a MOSFET, it is not limited to a discrete device but can be applied to an IC, an LSI, or the like.

According to the semiconductor device of the invention, since it can also be applied to a big-sized semiconductor chip, it is useful to various devices as well as a switching MOSFET.

What is claimed is:

1. A semiconductor device comprising:
a resin package;
at least two main leads integrated within the resin package so as to constitute a chip mounting portion;
a semiconductor chip mounted on the chip mounting portion; and
first and second surface leads each electrically connected to an electrode formed on a surface of the semiconductor chip, wherein:
the main leads and the first and second surface leads protrude outward along a bottom surface of the resin package, respectively, and
the main leads include a plurality of leads, the plurality of leads each having a larger width than the first and second surface leads or being configured such that the gap therebetween becomes smaller than that between the first and second surface leads in protruding regions of the main leads protruding outward from the resin package, wherein
the main leads and the first surface lead and the second surface lead are extended from the resin package outward in parallel to each other.

2. The semiconductor device according to claim 1, wherein the first and second surface leads are provided so as to be symmetrical with respect to a center line of the resin package in a protruding region thereof.

3. The semiconductor device according to claim 1, wherein the semiconductor chip is mounted on the chip mounting portion with a face thereof up.

4. The semiconductor device according to claim 1, wherein the main leads and the first and second surface leads are bent within the resin package, respectively.

5. The semiconductor device according to claim 1, wherein the chip mounting portion is formed on surfaces of the main leads which are located at an upper surface side of the resin package.

6. The semiconductor device according to claim 1, wherein at least one of the main leads has a width that is greater than the width of the first and second surface leads.

7. A semiconductor device comprising:
a resin package;
at least two main leads integrated within the resin package so as to constitute a chip mounting portion;
a semiconductor chip mounted on the chip mounting portion; and
first and second surface leads each electrically connected to an electrode formed on a surface of the semiconductor chip, wherein:
the main leads and the first and second surface leads protrude outward along a bottom surface of the resin package, respectively, and
the resin package is configured such that the distance from an upper surface of the semiconductor chip to an upper surface of the resin package is 0.25 to 0.40 mm.

8. The semiconductor device according to claim 7, wherein the main leads and the first and second surface leads are bent within the resin package, respectively.

9. The semiconductor device according to claim 7, wherein the chip mounting portion is formed on surfaces of the main leads which are located at an upper surface side of the resin package.

10. A semiconductor device comprising:
a resin package;
at least two main leads integrated within the resin package so as to constitute a chip mounting portion;
a semiconductor chip mounted on the chip mounting portion; and
first and second surface leads each electrically connected to an electrode formed on a surface of the semiconductor chip, wherein:
the main leads and the first and second surface leads protrude outward along a bottom surface of the resin package, respectively,
the main leads is formed with an opening, and
a sealing resin constituting the resin package is filled in the opening formed in the main leads.

11. The semiconductor device according to claim 10, wherein the main leads and the first and second surface leads are bent within the resin package, respectively.

12. The semiconductor device according to claim 10, wherein the chip mounting portion is formed on surfaces of the main leads which are located at an upper surface side of the resin package.

* * * * *